United States Patent [19]
McMillan et al.

[11] 3,986,897
[45] Oct. 19, 1976

[54] ALUMINUM TREATMENT TO PREVENT HILLOCKING

[75] Inventors: Larry D. McMillan, Scottsdale; Richard E. Shipley, Tempe, both of Ariz.

[73] Assignee: Motorola, Inc., Chicago, Ill.

[22] Filed: Sept. 30, 1974

[21] Appl. No.: 510,532

[52] U.S. Cl. ............................ 148/6.27; 427/88; 427/343; 156/22
[51] Int. Cl.² .................................... C23F 7/06
[58] Field of Search ............ 148/6.27; 156/22, 23; 117/217, 227; 427/88, 343

[56] References Cited
UNITED STATES PATENTS

| | | | |
|---|---|---|---|
| 2,859,148 | 11/1958 | Attenpohl | 148/6.27 |
| 2,948,392 | 8/1960 | Young | 148/6.27 |
| 3,247,026 | 4/1966 | Switzer | 148/6.27 |
| 3,380,860 | 4/1968 | Lipinski | 148/6.27 |
| 3,759,798 | 9/1973 | Graff et al. | 427/90 X |

*Primary Examiner*—Ralph S. Kendall
*Assistant Examiner*—Charles R. Wolfe, Jr.
*Attorney, Agent, or Firm*—Harry M. Weiss; Robert A. Farley

[57] ABSTRACT

A method of surface treating aluminum, particularly aluminum metallization for semiconductors, which includes subjecting the aluminum surface to be treated with fuming nitric acid for one to ten minutes at room temperature. Following cleaning, the surface is subjected to boiling water for 5 to 15 minutes. The foregoing treatment appears to form a boehmite (AlO(OH)) layer on the surface of the aluminum, thereby substantially eliminating hillocking.

5 Claims, No Drawings

ALUMINUM TREATMENT TO PREVENT HILLOCKING

BACKGROUND OF THE INVENTION

This invention relates to the treatment of aluminum surfaces and more particularly to the surface treatment of an aluminum metallization system. Still more particularly, this invention relates to the treatment of aluminum metallization for silicon semiconductor devices.

The requirements for a material, or system of materials, to provide ohmic contact to and metallization stripes from semiconductor devices is extremely stringent from a mechanical, electrical and chemical view. Obviously, the first criteria must be that the material provide good electrical conductivity and ohmic contact to the semiconductor region. In standard planar types of semiconductor devices and integrated circuits, the material must not only make good ohmic contact to the silicon, but good mechanical contact to the silicon and to the silicon dioxide regions surrounding the contact area. Not only must the material bond well to the silicon oxide, but also, particularly in multilevel systems, to silica glasses or glasses of other types. These glasses should have good adherence to the material upon deposition thereon. Preferably, the material has a temperature coefficient of expansion closely matching the material in which it must be in contact. For manufacturing reasons, the material should be easy to deposit by standard evaporation or sputtering techniques and be easily patterned by etching or similar techniques. Since, in certain instances, it will be necessary to bond either gold or aluminum wires to the contact or metallization regions, these materials must be readily bondable to the material by standard thermocompression of ultrasonic bonding techniques. In use, the material should be mechanically strong, corrosion resistant and not subject to hillocking, electromigration, or similar thermal or electrical stress defects.

The only single metal previously found at all suitable for contacts and interconnections in silicon planar transistors and integrated circuits is aluminum, which material has been widely utilized for these purposes. The three most common problems attendant to the use of aluminum are:

1. Pitting of the aluminum in the silicon contact area.
2. Electromigration.
3. Its thermal expansion characteristics relative to that of silicon and/or silicon dioxide.

This latter characteristic results in hillocking of the metallization stripes which can crack the dielectric material, particularly in multilevel structures. To some degree the problems of electromigration and etch pitting of the silicon have been alleviated by the addition of small amounts of alloying impurities such as copper or silicon into the aluminum. A suggestion as a solution for hillocking has been annodizing of the aluminum surface. However, these methods have not been entirely successful, since hillocking is still found to occur, particularly when the devices are heated to or operated at elevated temperatures.

OBJECTS OF THE INVENTION

It is an object of this invention to eliminate, or substantially eliminate, hillocking of aluminum surfaces.

A still further object of the invention is to provide a method of treating silicon planar semiconductor devices having aluminum metallization thereon to improve the mechanical characteristics of the metallization.

A still further object of the invention is to provide planar silicon semiconductors having contacts and interconnects which are resistant to hillocking.

A still further object of the invention is to provide an improved multilayer metallization system for semiconductor devices which includes an improved surface treatment of such metallization.

SUMMARY OF THE INVENTION

In accordance with the foregoing, there is provided a method of surface treating aluminum comprising the steps of subjecting the aluminum surface to be treated with fuming nitric acid for one to ten minutes at room temperature and then subjecting the surface to boiling water for one to ten minutes. The foregoing method of treatment is believed to result in an aluminum surface having a boehmite layer thereon, which aluminum surface is resistant to hillocking.

COMPLETE DESCRIPTION OF THE INVENTION

By way of background to the invention, it will be understood that the treatment is particularly applicable to a semiconductor device, such as a bipolar integrated circuit, which includes a substrate of a conductivity having a buried layer of N type conductivity therein and with an epitaxial layer grown thereover. By standard masking and diffusion techniques, junction isolation, base, emitter, and collector contact regions are formed therein. Following covering of all of the foregoing regions with a dielectric layer, such as silicon oxide, appropriate windows are opened therein and a layer of aluminum metallization deposited thereon. This aluminum metallization may then be formed into the contacts and interconnects in accordance with well known techniques either before or after treatment, in accordance with the present invention.

Typically, the foregoing described structure will be formed in a circular wafer of silicon, either two or three inches in diameter and thus the aluminum metallization will appear over the entire surface of the foregoing. For the purpose of the following discussion, it will be assumed that the wafers are treated without further definition of a metallization, since it has been found, in accordance with the invention, that definition of the metallization layer may be accomplished as easily following treatment as it would be prior to treatment.

Aluminum, as used herein and in accordance with prior usage in the semiconductor industry, can be substantially pure aluminum or may include 1.5 percent additions of silicon and/or copper.

Since wafers of the foregoing type are subject to hillocking, it has been found that treatment with fuming nitric acid and then with boiling water alleviates the problem. "Fuming" nitric acid is concentrated nitric acid having an $HNO_3$ content of 80 percent or more. It is believed that the nitric acid oxidizes the surface of the aluminum to form $Al_2O_3$ and that the boiling water treatment converts this to $AlO(OH)$ which compound is known as boehmite.

Two wafers having substantially pure aluminum metallization thereon were immersed in individual fuming nitric acid baths for five minutes. One bath was at room temperature, the second at an elevated temperature (approximately 80° C). Both wafers were immersed in boiling water for 15 minutes. To test the effectiveness of the treatment, the wafers were heated at 470° C for 15 minutes without effecting any hillocking of the metallization. Another wafer similarly treated except for the boiling water step resulted in many hillocks in the aluminum. Further tests demonstrated that approximately three minutes of treatment in the fuming nitric acid and three minutes in boiling water substantially eliminated hillocking.

Further examples are as follows:

| Number | Metal | $HNO_3$(Time) | $H_2O$ Time | Hillocking |
|---|---|---|---|---|
| 1 | Al | 3 | 5 | None |
| 2 | Al | 10 | 15 | None |
| 3 | Al - Si | 3 | 5 | None |
| 4 | Al - Si | 10 | 10 | None |
| 5 | Al - Cu | 3 | 5 | None |
| 6 | Al - Cu | 10 | 10 | None |

While the invention has been disclosed by way of the preferred embodiment thereof, it will be understood that suitable modifications may be made therein without departing from the spirit and scope of the invention.

What is claimed is;

1. In a method of manufacturing semiconductors including the steps of forming semiconductor junction regions in a surface of a semiconductor substrate; covering the surface with a dielectric layer; opening windows therein; and depositing aluminum metallization thereover; a process for eliminating hillocking of said aluminum metallization comprising the steps of:
   subjecting the aluminum metallization to fuming nitric acid for one to ten minutes; and
   subjecting the treated surface to boiling water for five to fifteen minutes.

2. A method as recited in claim 1 wherein said surface is cleaned prior to the boiling water step.

3. A method as recited in claim 1 wherein said aluminum is selected from the group consisting essentially of aluminum and alloys thereof containing silicon and copper.

4. A method as recited in claim 1 wherein said surface is treated with nitric acid for a period of three minutes.

5. A method as recited in claim 1 wherein said fuming nitric acid has a concentration of more than 80 percent $HNO_3$.

* * * * *